(12) United States Patent
Mabuchi

(10) Patent No.: US 7,868,283 B2
(45) Date of Patent: Jan. 11, 2011

(54) PHYSICAL QUANTITY DETECTION DEVICE WITH PIXEL ARRAY COLUMN-ALIGNED TERMINALS AND METHOD OF DRIVING SAME

(75) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/841,130

(22) Filed: Aug. 20, 2007

(65) Prior Publication Data
US 2008/0042046 A1    Feb. 21, 2008

(30) Foreign Application Priority Data
Aug. 21, 2006  (JP) .............. 2006-223879

(51) Int. Cl.
*H01L 27/00* (2006.01)

(52) U.S. Cl. ............. 250/208.1; 250/214.1; 250/214 R; 257/292; 257/777; 257/778; 348/294; 348/302

(58) Field of Classification Search .............. 250/208.1, 250/214.1, 214 R, 214 DC, 208.2; 257/292, 257/783, 777, 778, 787, 792; 348/294, 302, 348/311

See application file for complete search history.

(56) References Cited

U.S. PATENT DOCUMENTS

| 6,872,992 | B2 * | 3/2005 | Muramatsu | ................. 257/228 |
| 7,402,811 | B2 * | 7/2008 | Hatanaka et al. | ....... 250/370.09 |
| 2001/0022572 | A1 * | 9/2001 | Murade | ....................... 345/98 |
| 2004/0026771 | A1 * | 2/2004 | Layman et al. | ............. 257/686 |
| 2005/0161814 | A1 * | 7/2005 | Mizukoshi et al. | .......... 257/737 |
| 2005/0181539 | A1 * | 8/2005 | Ohie | .......................... 438/108 |
| 2005/0253176 | A1 * | 11/2005 | Pyo | ............................. 257/292 |
| 2006/0109359 | A1 | 5/2006 | Matsumoto et al. | |

FOREIGN PATENT DOCUMENTS

| JP | 2003-264280 | 9/2003 |
| JP | 2004-064410 | 2/2004 |
| JP | 2006-074075 | 3/2006 |
| JP | 2006-135481 | 5/2006 |
| WO | WO 2004/105137 | 12/2004 |
| WO | WO 2006/129762 | 12/2006 |

OTHER PUBLICATIONS

Japanese Office Action dated Sep. 2, 2008 for Application No. 2006-223879.

* cited by examiner

*Primary Examiner*—Georgia Y Epps
*Assistant Examiner*—Francis M Legasse, Jr.
(74) *Attorney, Agent, or Firm*—SNR Denton US LLP

(57) ABSTRACT

A physical-quantity detection device includes at least two semiconductor substrates exchanging a pixel signal read from a pixel-array section including pixels, disposed in a two-dimensional matrix, for converting a physical quantity given from outside into an electrical signal. The two semiconductor substrates have a plurality of terminals connected in parallel and arranged with duplicate pitches with each other in the same direction as a row direction of the pixel-array section, one of the semiconductor substrates transmits the pixel signal to the other of the semiconductor substrates in parallel through the terminals connected in parallel, and the other of the semiconductor substrates scans the transmitted pixel signal to input the signal to a next stage circuit.

8 Claims, 12 Drawing Sheets

PHYSICAL QUANTITY DETECTION DEVICE WITH PIXEL ARRAY COLUMN-ALIGNED TERMINALS AND METHOD OF DRIVING SAME

CROSS REFERENCES TO RELATED APPLICATIONS

The present invention contains subject matter related to Japanese Patent Application JP 2006-223879 filed in the Japanese Patent Office on Aug. 21, 2006, the entire contents of which are incorporated herein by reference.

BACKGROUND OF THE INVENTION

1. Field of the Invention

The present invention relates to a physical-quantity detection device detecting a physical quantity given from outside, a method of driving the physical-quantity detection device, and an imaging apparatus detecting light given from outside as a physical quantity.

2. Description of the Related Art

Camera systems, such as a video camera, an electronic still camera, etc., include a solid-state imaging device including an image sensor having a sensing function for capturing an image, a DSP (digital signal processor) circuit having a signal processing function, a memory circuit having a data-storage function, etc. Also, as shown in FIG. 10, some of the solid-state imaging devices have the configuration including a semiconductor substrate (in the following, referred to as a "sensor chip") 51 on which image sensors are mounted, a semiconductor substrate (in the following, referred to as a "DSP chip") 52 on which a DSP circuit is mounted, and a semiconductor substrate (in the following, referred to as a "memory chip") 53 on which a memory circuit is mounted as individually separate substrates (chips) (for example, refer to Japanese Unexamined Patent Application Publication No. 2006-135481 (FIG. 5)).

In such a configuration, the sensor chip 51 and the DSP chip 52 have been connected by wire bonding with a narrow-width bus of about a few pixels, and the DSP chip 52 and the memory chip 53 have been connected by wire bonding with a narrow-width bus of about a few tens of words. Also, the signal output from the sensor chip 51 to the DSP chip 52 is basically a method (a serial method) of outputting a signal read from each of the pixels in sequence while scanning the pixels for one screen (one frame) in the horizontal direction and the vertical direction.

SUMMARY OF THE INVENTION

However, in a system in which a plurality of chips are linked as the above-described known example, there has been a problem in that the transfer efficiency of signals among the chips is low. Accordingly, the present applicant has proposed a solid-state imaging device employing the configuration as shown in FIG. 11. In the configuration of the solid-state imaging device shown in the figure, a sensor chip 51 and a memory chip 53 are connected in parallel with micro bumps, and the memory chip 53 and a DSP chip 52 are connected by wire bonding with a narrow-width bus. With this arrangement, it is possible to output a signal with a wide-width bus from the sensor chip 51 to the memory chip 53. However, the DSP chip 52 serially processes the signal, and thus only a signal with a narrow bus width as before is allowed to be output from the memory chip 53 to the DSP chip 52, thereby resulting in a bottle neck. For example, an image signal is exchanged between the memory chip 53 and the DSP chip 52 for each one pixel or for a few pixels in sequence while the memory chip 53 carries out horizontal scanning.

Also, when the pixel array on the sensor chip 51 and the memory-cell array on the memory chip 53 are disposed to have one-to-one relationship, it is necessary to match the column pitch of the sensor chip 51 and the column pitch of the memory chip 53, or to dispose a wiring section for converting the column pitch on one of the chips. Thus, in the former case, the memory cells needs to be re-created for each of the different pixel sizes. Also, in the latter case, it is necessary to allocate a wide wiring section for the pitch conversion on the chip. Specifically, as shown in FIG. 12, assuming that the depth size of the wiring section for converting the array pitch of the terminals (1 to 10) from Pa to Pb is La, it is necessary to allocate a portion having a size of about a fraction of the length Lb of one side of the chip for connecting with micro bumps in parallel.

According to an embodiment of the present invention, there is provided a physical-quantity detection device comprising at least two semiconductor substrates exchanging a pixel signal read from a pixel-array section including pixels, disposed in a two-dimensional matrix, for converting a physical quantity given from outside into an electrical signal, wherein the two semiconductor substrates have a plurality of terminals connected in parallel and arranged with duplicate pitches with each other in the same direction as a row direction of the pixel-array section, one of the semiconductor substrates transmits the pixel signal to the other of the semiconductor substrates in parallel through the terminals connected in parallel, and the other of the semiconductor substrates scans the transmitted pixel signal to input the signal into a next stage circuit.

In a physical-quantity detection device according to the present invention, one of the semiconductor substrates transmits a pixel signal to the other of the semiconductor substrates in parallel, and the pixel signal is scanned in the other of the semiconductor substrates to be input into a next stage circuit. Thus, in the other of the semiconductor substrates which receives the pixel signal from one of the semiconductor substrates by parallel transmission, it is possible to perform the parallel-to-serial conversion of the pixel signal, or to perform the pitch conversion.

By the present invention, the parallel-to-serial conversion of the pixel signal is performed by the other of the semiconductor substrates, which receives a pixel signal from one of the semiconductor substrates by parallel transmission. Thus, for example when a signal processing circuit (DSP circuit) is mounted on the other of the semiconductor substrates, it is possible to serialize the pixel signal on the other of the semiconductor substrates to input the signal into the signal processing circuit while exchanging the signal at a high speed, with low power consumption and low radiation by the parallel connection of the terminals between two semiconductor substrates. Also, for example when an image sensor is mounted on one of the semiconductor substrates and a memory circuit is mounted on the other of the semiconductor substrates, it is possible to convert the pitch in a small area on the other of the semiconductor substrates by connecting a plurality of the terminals with each other in parallel, which are arranged on both of the semiconductor substrates with duplicate pitches.

DESCRIPTION OF THE PREFERRED EMBODIMENTS

In the following, a detailed description will be given of specific embodiments of the present invention with reference to the drawings.

Here, a description will be given of a solid-state imaging device detecting the intensity of the incident light reflected from an object, for example as a physical-quantity detection device detecting a physical quantity given from the outside. Also, in the embodiments of the present invention, a description will be given using a CMOS (Complementary Metal Oxide Semiconductor) image sensor, for example, as an image sensor of the solid-state imaging device.

First Embodiment

Figure 1:
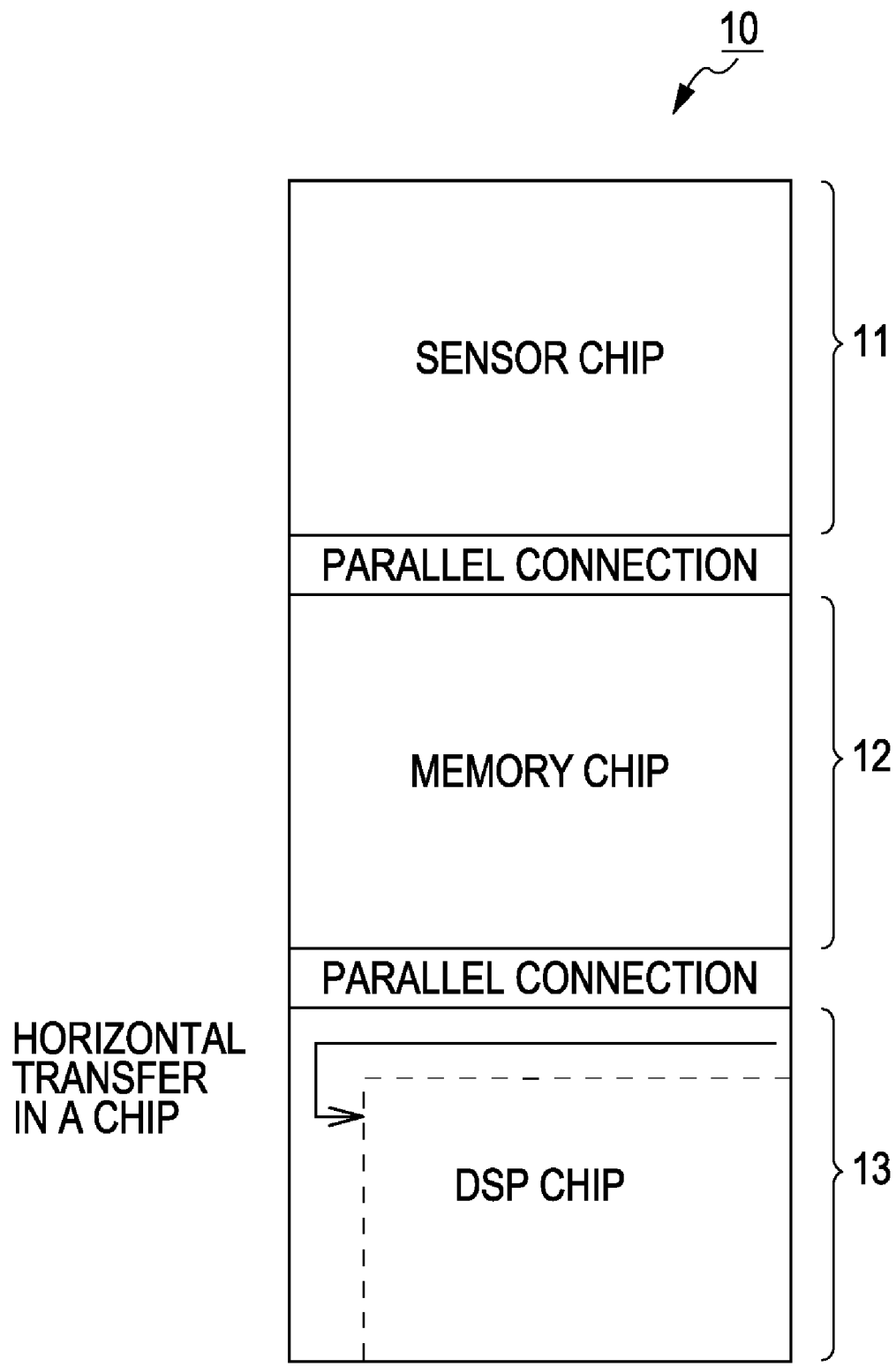
FIG. 1 is a schematic diagram illustrating an electrical connection state of a solid-state imaging device according to a first embodiment of the present invention.
Figure 2:
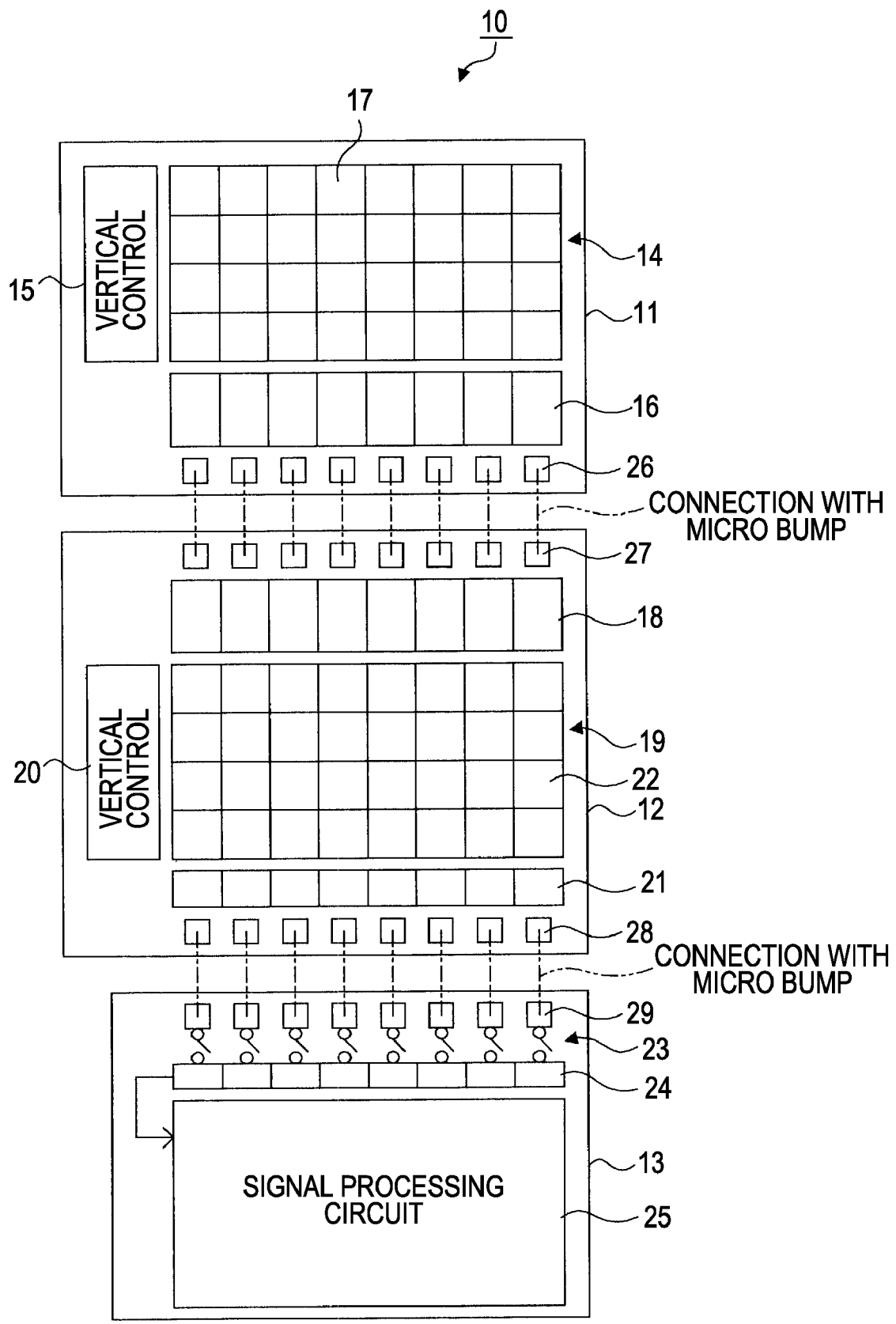
FIG. 2 is a development view illustrating the schematic configuration of the solid-state imaging device according to the first embodiment of the present invention.

FIG. 1 is a schematic diagram illustrating an electrical connection state of a solid-state imaging device according to a first embodiment of the present invention. Also, FIG. 2 is a development view illustrating the schematic configuration of the solid-state imaging device according to the first embodiment of the present invention.

The solid-state imaging device 10 shown in the figure includes a first semiconductor substrate 11, a second semiconductor substrate 12, and a third semiconductor substrate 13. The first semiconductor substrate 11 is a chip-state substrate (in the following, referred to as a "sensor chip") on which a CMOS image sensor is mainly mounted. The second semiconductor substrate 12 is a chip-state substrate (in the following, referred to as a "memory chip") on which a memory circuit is mainly mounted. The third semiconductor substrate 13 is a chip-state substrate (in the following, referred to as a "DSP chip") on which a DSP circuit is mainly mounted.

Figure 3A:
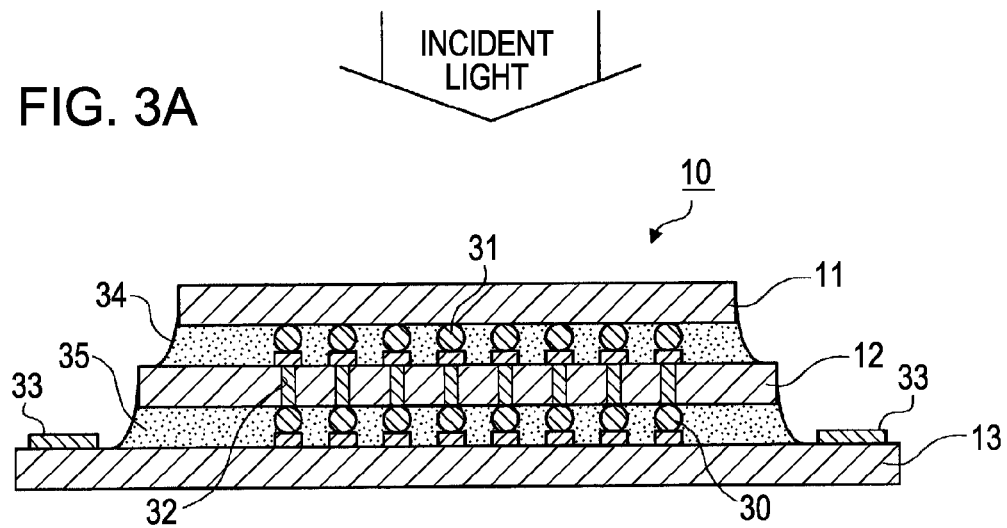
FIGS. 3A and 3B are diagrams illustrating the implementation structure of the solid-state imaging device according to the first embodiment of the present invention.
Figure 3B:
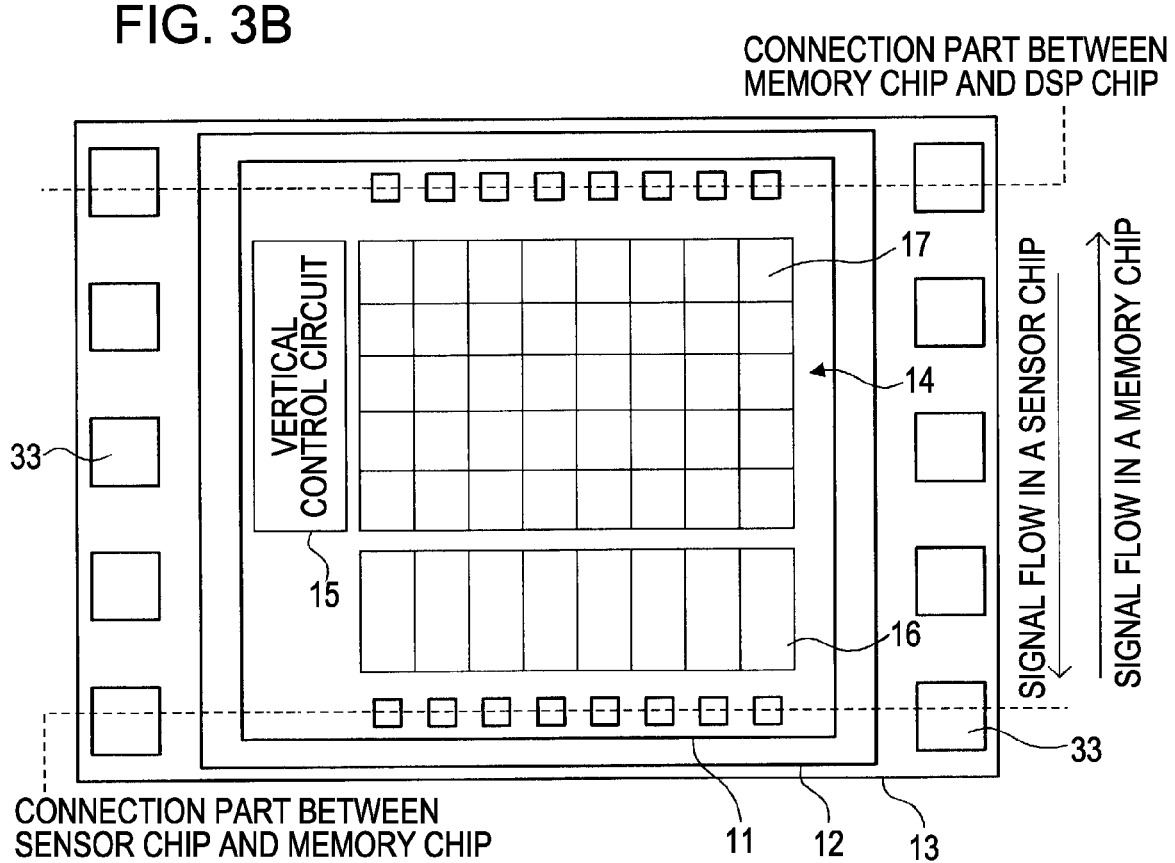

FIG. 3A is a schematic side view illustrating the implementation structure of the solid-state imaging device according to the first embodiment of the present invention, and FIG. 3B is a schematic plan view of the same. In this regard, FIG. 3A shows the connection part between the memory chip 12 and the DSP chip 13 in FIG. 3B. As is apparent from the figure, the solid-state imaging device 10 has a package structure in which the sensor chip 11, the memory chip 12 having a larger plan view size then that of the sensor chip 11, and the DSP chip 13 having a larger plan view size then that of the memory chip 12 are piled up one another. That is to say, the sensor chip 11 is mounted on the memory chip 12, and the memory chip 12 is mounted on the DSP chip 13. Thus, the solid-state imaging device 10 has a three-tier structure in which three chips 11, 12, and 13 are laminated.

To give a more detailed description, a pixel array section 14, a vertical control circuit 15, a column circuit 16, etc., are formed on the sensor chip 11. The pixel array section 14 has a configuration in which a large number of pixels 17 including a photoelectric conversion element converting incident light into the amount of the charge (electronic signal) in accordance with the amount of the incident light (a physical quantity given from the outside) are disposed in a two-dimensional matrix.

The vertical control circuit 15 selectively scans each pixel 17 of the pixel array section 14 for each row in sequence in the vertical direction, and supplies a drive pulse (control pulse) to each pixel of the selected row through a pixel drive wiring (not shown in the figure). Thus, the vertical control circuit 15 reads a signal (pixel signal) from each pixel by operating the pixels in the selected row in parallel.

The column circuit 16 processes and holds the signal read from each pixel 17 of the selected row. To give a more detailed description, the column circuit 16 is disposed in the lower part of the pixel array section 14, for example, for each pixel column of the pixel array section 14, that is to say, with a one-to-one relationship with one pixel column. The column circuit 16 receives the signal read from each of the pixels 17 for one row by each pixel column, and performs signal processing, on the signal, such as CDS (Correlated Double Sampling) for eliminating a pixel-specific fixed pattern noise, signal amplification, A/D (Analog/Digital) conversion, black-level clamp, longitudinal stripe correction, etc., thereby holding the analog signal read from each of the pixels 17 as a digital signal eventually.

At the same time, a column circuit 18, a memory circuit 19, a vertical control circuit 20, a sense-amplifier circuit 21, etc., are formed on the memory chip 12. The column circuit 18 performs write processing of the pixel signal transmitted from the sensor chip 11 into the memory circuit 19, calculation processing (for example, addition processing) of the pixel signal transmitted from the sensor chip 11 to the memory chip 12 and the pixel signal written into and read from the memory circuit 19 in advance of the above write processing, write-back processing of the calculation result into the memory circuit 19, etc.

The memory circuit 19 includes a memory area including memory cells 22 for one screen (one frame), and each memory cell corresponds to, for example one pixel of the pixel array section 14, that is to say, has a one-to-one relationship with one pixel. For example, when the pixel array section 14 includes pixels 17 disposed in a two-dimensional matrix with i rows and j columns, the memory circuit 19 includes a memory area (frame memory) including memory cells 22 with i rows and j columns so as to correspond to the pixels with a one-to-one relationship. One of the memory cells 22 is constituted by, for example one memory unit of 16 bits.

When a signal is written into or read from the memory circuit 19, the vertical control circuit 20 selects the memory cells 22 to which the signal is written or read from by row, and drives the memory cells 22 of the selected row. The sense-amplifier circuit 21 is disposed at the opposite side of the column circuit 18 across the memory circuit 19. The sense-amplifier circuit 21 reads out the pixel signal or writes the pixel signal into the memory circuit 19.

At the same time, a switch circuit 23, a shift register 24, a signal processing circuit 25 including a DSP circuit, etc., are formed on the DSP chip 13. The switch circuit 23 includes a plurality of switch elements corresponding to the number of transfer stages of the shift register 24. The switch circuit 23 and the shift register 24 horizontally scan the pixel signal transferred from the memory chip 12 to the DSP chip 13, and thereby converts the pixel signal from the parallel signal to the serial signal, and inputs the serial signal into the next-stage signal processing circuit (DSP circuit) 25. The shift register 24 may include a plurality of rows. The signal processing circuit 25 performs serial processing on the pixel signal transferred from the memory chip 12 to the DSP chip 13 in order to correct camera shake and to enlarge the dynamic range.

Also, a large number of micro pads 26 are formed on one side of the sensor chip 11, and a large number of micro pads 27 are also formed on one side of the memory chip 12 correspondingly. Each one of the micro pads 26 is formed on the sensor chip 11 for each unit pixel column including each one pixel or a plurality of pixels (a few pixels) as a unit. For example, assuming that the pixel column of the pixel array section 14 includes 1000 columns, when a micro pad 26 is formed for each one pixel, the number of formed micro pads 26 becomes 1000, and when a micro pad 26 is formed for each two pixels, the number of formed micro pads 26 becomes 500.

Also, a large number of micro pads 29 are formed on one side of the DSP chip 13, and a large number of micro pads 28 are also formed on the other side of the memory chip 12 correspondingly. These micro pads 26 to 29 become internal connection terminals for electrically connecting the sensor chip 11 and the memory chip 12, and the memory chip 12 and the DSP chip 13, respectively in the solid-state imaging device 10. The micro pad is a very little pad of, for example 60 μm square or less, furthermore about 20 μm square, which is smaller than a usual pad of about 100 μm square.

Here, in the direction along the row direction of the pixel array section 14, the micro pads 26 formed on the sensor chip 11 and the micro pads 27 formed on the memory chip 12 are disposed with duplicate pitches with each other. Also, the micro pads 28 formed on the memory chip 12 and the micro pads 29 formed on the DSP chip 13 are disposed with duplicate pitches with each other. That is to say, a plurality of micro pads 26 and 27 are formed on the sensor chip 11 and the memory chip 12 with duplicate pitches with each other, and a plurality of micro pads 28 and 29 are also formed on the memory chip 12 and the DSP chip 13 with duplicate pitches with each other. The micro pads 27 and 28 formed on the memory chip 12 may be formed with duplicate pitches, or may be formed with different pitches. Also, the micro pads 26 and the micro pads 27 have a one-to-one relationship, and the micro pads 28 and the micro pads 29 have a one-to-one relationship.

The sensor chip 11 is a "back-face incident type pixel structure" CMOS image sensor having the configuration in which light enters into a pixel from the back face side of the substrate. A wiring layer for driving pixels is formed on the other side, namely, the front face of the substrate. Also, a wiring layer for driving the memory cells 22 is formed on the front face side of the memory chip 12. A wiring layer for processing the signal is formed on the front face side of the DSP chip 13. In a state of implementation in which three chips 11, 12, and 13 are plied up on another, the sensor chip 11 and the memory chip 12 are piled up in a state in which the front faces of the substrates on which the wiring layer is formed are opposed to each other, and the memory chip 12 and the DSP chip 13 are piled up in a state in which the back face of the substrate of the memory chip 12 and the front face of the substrate of the DSP chip 13 are opposed to each other.

In contrast, the micro pad 26 is formed on the front face of the sensor chip 11, and the micro pad 27 is formed on the front face of the memory chip 12. Also, the micro pad 28 is formed on the back face of the memory chip 12, and the micro pad 29 is formed on the front face of the DSP chip 13. Also, the micro pad 26 and the micro pad 27 are electrically connected by the micro bumps (not shown in the figure) with a one-to-one relationship, and the micro pad 28 and the micro pad 29 are electrically connected by the micro bumps 30 with a one-to-one relationship. The micro bump is a very little bump having, for example a diameter of 30 μm or less, furthermore a diameter of about 10 μm, which is smaller than a usual bump having a diameter of about 50 μm.

Also, as shown in the above FIG. 3B, in a plan view of the implementation structure of the solid-state imaging device 10, the electrical connection part (the electrical connection part between the micro pads 26 and 27) between the sensor chip 11 and the memory chip 12 is provided at one of the sides (lower side in the figure) of the memory chip 12, and the electrical connection part (the electrical connection part between the micro pads 28 and 29) between the memory chip 12 and the DSP chip 13 is provided at the other of the sides (upper side in the figure) of the memory chip 12. Thus, when a pixel signal is transferred from the sensor chip 11 to the DSP chip 13 through the memory chip 12, the direction of the signal flowing in the sensor chip 11 becomes the opposite direction of the signal flowing in the memory chip 12.

Also, when the chips are piled up one another, in order to prevent the chips from being inclined, dummy micro bumps (in the following, referred to as "dummy bumps") are provided between the chips for adjusting the heights. That is to say, dummy bumps 31 are provided between the sensor chip 11 and the memory chip 12 at the opposite side to the electrical connection part between the two chips, and dummy bumps (not shown in the figure) are provided between the memory chip 12 and the DSP chip 13 at the opposite side to the electrical connection part between the two chips. The chips are piled up one above the other in parallel relation to one another by these dummy bumps being provided between the chips.

Also, on the memory chip 12, in order to make a conductive connection between the front face and the back face of the substrate (chip), a conductive path 32 passing through the memory chip 12 is formed by, for example by making a through hole in the substrate and filling the through hole with a wiring material, and thus micro bumps are formed at the portion where the conductive path 32 is formed. In this manner, by forming the conductive path 32 in the memory chip 12, the tree chips 11, 12, and 13 are piled up in three stages in a state in which the sensor chip 11, the memory chip 12, and the memory chip 12 and the DSP chip 13 are electrically connected by micro bumps, respectively. Thus, the package structure of the solid-state imaging device 10 becomes high-density implementation. Although not shown in the figure, it is also possible to connect the sensor chip 11 and the DSP chip 13 through the conductive path 32.

A plurality of usual pads 33 for external connection are formed on the DSP chip 13. Both sides of the DSP chip 13 protrude from the edges of the memory chip 12 mounted on the DSP chip 13, and a plurality of pads 33 are formed on the protruding parts (both sides of the chip). Between the solid-state imaging device 10 and the outside, for example, when the solid-state imaging device 10 is mounted on an external mother substrate (not shown in the figure), these pads 33 becomes external connection terminals for electrically connecting the solid-state imaging device 10 and the mother substrate (external substrate) in order to transmit and receive an address and various signals to and from the outside.

Also, between the sensor chip 11 and the memory chip 12 (a gap between them), at least the surrounding areas of the chips are sealed by sealing member 34, such as resin, etc., so as to cover the electrical connection part with micro bumps. Between the memory chip 12 and the DSP chip 13 (a gap between them), at least the surrounding area of the chips is sealed by sealing member 35, such as resin, etc., so as to cover the electrical connection part with micro bumps.

In the solid-state imaging device 10 having the above-described configuration, the sensor chip 11 and the memory chip 12 are electrically connected by connecting a plurality of the micro pads 26 and 27 disposed with duplicate pitches with each other on the sensor chip 11 and the memory chip 12, respectively. At the same time, the memory chip 12 and the DSP chip 13 are electrically connected by connecting a plurality of the micro pads 28 and 29 disposed with duplicate pitches with each other, respectively. Thus, the pixel signals of each pixel column read out from the pixel array section 14 for each one row can be transferred in parallel from the sensor chip 11 to the memory chip 12, and further, the signals can be transferred in parallel from the memory chip 12 to the DSP chip 13.

Also, the DSP chip 13, which has received the pixel signal transferred in parallel from the memory chip 12, horizontally scans the pixel signal by the switch circuit 23 and the shift register 24, and thereby converts the pixel signal from the parallel signal to the serial signal, horizontally transfers the signal in the chip, and inputs the signal into the next-stage signal processing circuit 25. Thus, although the pixel signal is transferred in parallel between the memory chip 12 and the DSP chip 13, the signal processing circuit 25 can process the pixel signal by the serial processing.

Second Embodiment

Figure 4:
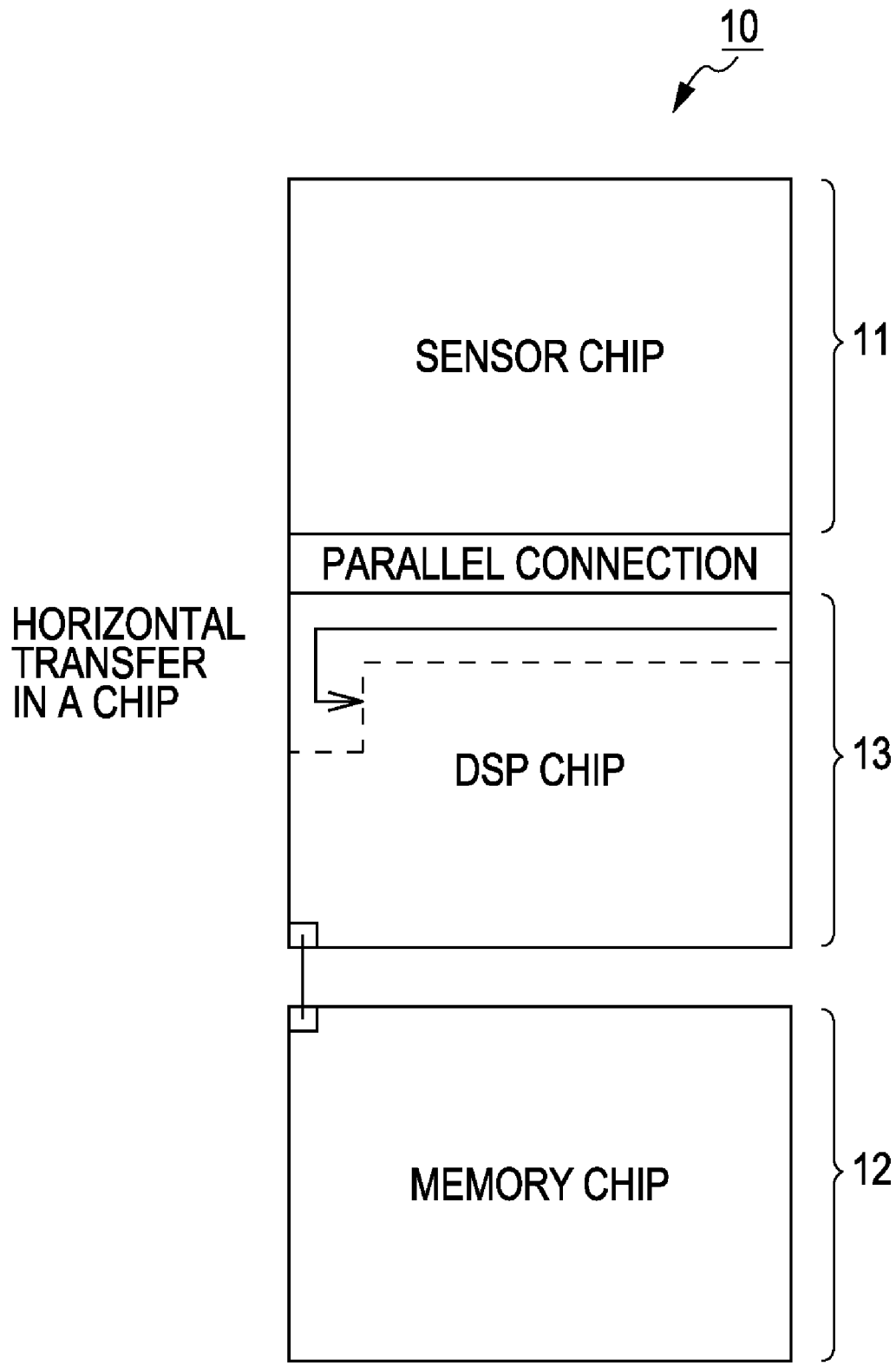
FIG. 4 is a schematic diagram illustrating an electrical connection state of a solid-state imaging device according to a second embodiment of the present invention.
Figure 5:
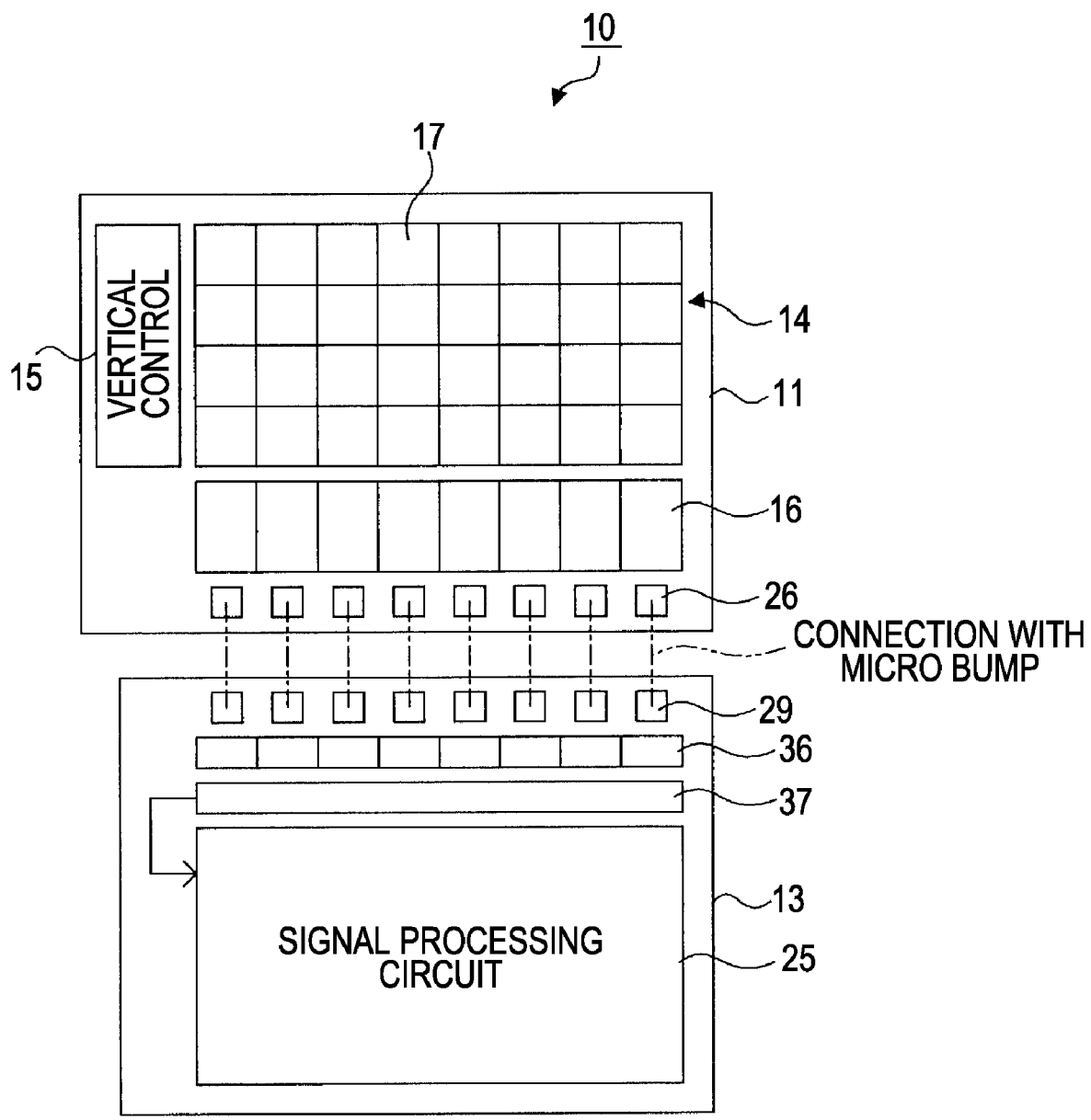
FIG. 5 is a development view illustrating the schematic configuration of the solid-state imaging device according to the second embodiment of the present invention.

FIG. 4 is a schematic diagram illustrating an electrical connection state of a solid-state imaging device according to a second embodiment of the present invention. Also, FIG. 5 is a development view illustrating the schematic configuration of the solid-state imaging device according to the second embodiment of the present invention. In this regard, in FIG. 5, the display of the memory chip 12 is omitted. Also, in the second embodiment, the same components as those in the first embodiment are marked with the same reference numerals, and the duplicate description will be omitted.

In the solid-state imaging device 10, the sensor chip 11 and the DSP chip 13 are connected in parallel (column parallel) by micro bumps for example, for each unit pixel column using one pixel or a plurality of pixels (a few pixels) as one unit. Thus, the pixel signal is transmitted in parallel from the sensor chip 11 to the DSP chip 13. Also, the DSP chip 13 and the memory chip 12 are connected by wire bonding, for example with a bus of about tens of bits in width. Accordingly, the pixel signal is serially transmitted from the DSP chip 13 and the memory chip 12.

A latch circuit 36, a multiplexer 37, etc., are formed on the DSP chip 13. The latch circuit 36 is disposed in a one-to-one relationship with a plurality of micro pads 29 formed on the DSP chip 13. The latch circuit 36 holds the pixel signal transferred in parallel from the sensor chip 11. The multiplexer 37 sequentially selects the pixel signal held by the latch circuit 36 by switching in sequence and outputs the signal. Thus, the multiplexer 37 selects the pixel signals held by the latch circuit 36 in the horizontal direction in sequence from one side to the other and outputs the signal, and thus horizontally scans the pixel signals, thereby making it possible to convert the parallel signal to the serial signal. Also, it is possible to sort the pixel signals in any order, or to take out only a necessary signal using the multiplexer 37 for scanning.

Figure 6:
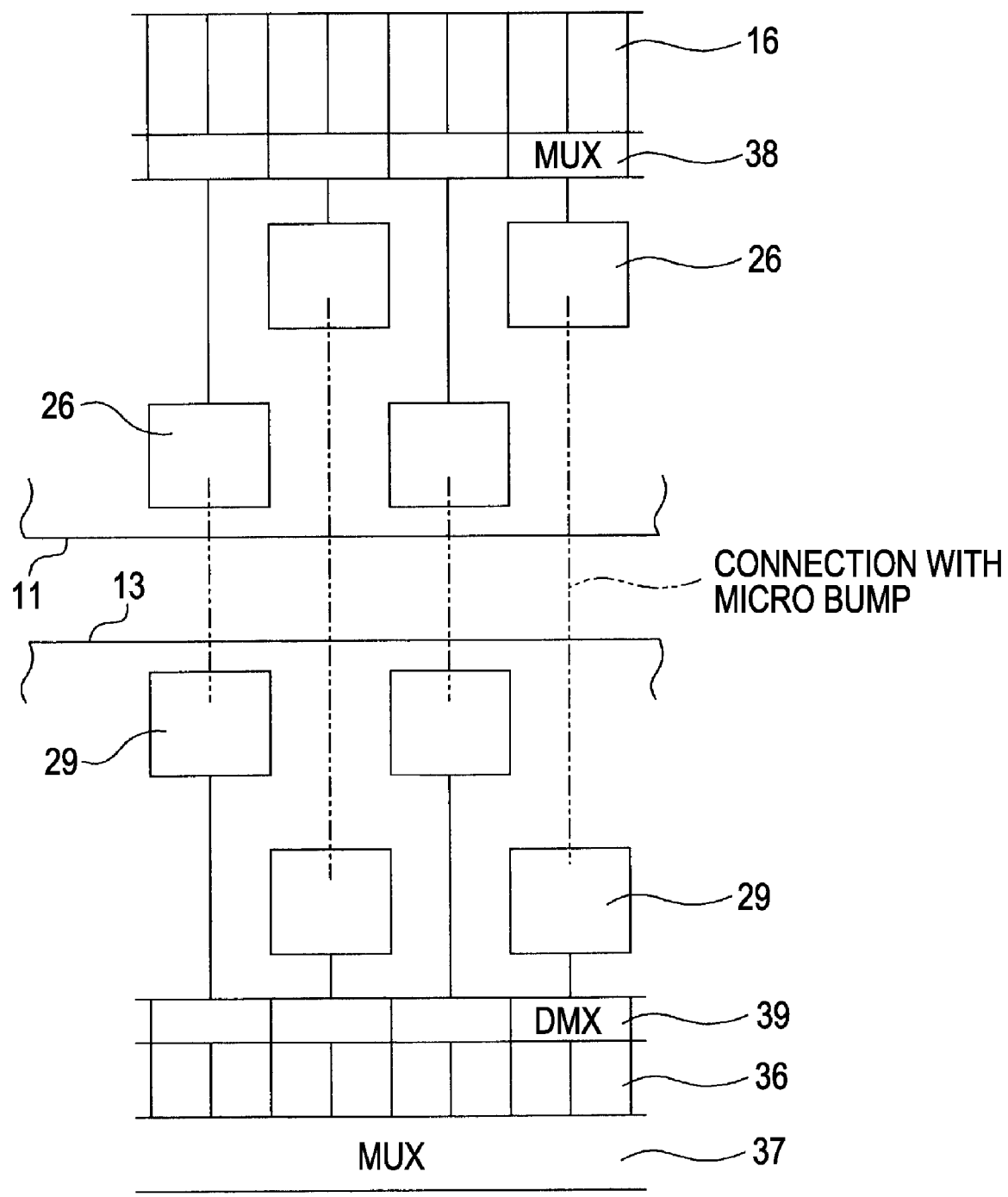
FIG. 6 is an enlarged view of an example of the arrangement of the electrical connection part between a sensor chip and a DSP chip in the second embodiment of the present invention.

FIG. 6 is an enlarged view of an example of the arrangement of the electrical connection part between the sensor chip 11 and the DSP chip 13. In the sensor chip 11, for example the column of one pixel 17 corresponds to one column circuit 16. Also, each of the pixel signals processed by two column circuits 16 is switched by the multiplexer 38, and is led to each micro pad 26. The micro pads 26 correspond to narrow pitches of the pixel 17 and the column circuit 16 by being disposed with their locations shifted vertically (staggered) on a cycle of four columns.

At the same time, a plurality of micro pads 29 are formed on the DSP chip 13 so as to correspond to the micro pads 26 of the sensor chip 11 with a one-to-one relationship when the sensor chip 11 and the DSP chip 13 are piled up as opposed to each other. The micro pads 26 and 29, which are corresponding to each other, are electrically connected by micro bumps in the same manner as the first embodiment when the sensor chip 11 and the DSP chip 13 are connected in parallel.

In the DSP chip 13, one demultiplexer 39 corresponds to one micro pad 29. Also, two latch circuits 36 correspond to one demultiplexer 39. Thus, the pixel signal transferred in parallel from the sensor chip 11 to the DSP chip 13 is demultiplexed by the demultiplexer 39 to be stored into the two latch circuits 36 separately. Furthermore, the pixel signal is selectively scanned by the multiplexer 37 to be converted from the parallel signal into the serial signal, and then is input into the next-stage signal processing circuit 25.

Here, in the second embodiment, the sensor chip 11 and the DSP chip 13 are connected in column parallel. However, the column parallel means that the column pitch of the column circuit does not necessarily need to completely match the pitch of the micro bump (micro pad). If the array cycle of the micro bumps is an integer multiple of the column pitch, and 100 pieces or more are arranged (having 100 columns or more in parallel), it is recognized as column parallel. Also, this is the same for the pixel pitch and the pitch of the column circuit. For example, there is a case where one column circuit is provided for each two columns of pixels. Here, the column parallel is defined when the array cycle of the column circuit is an integer multiple of the cycle of the pixel column, and 100 pieces or more are arranged.

In the solid-state imaging device 10 having the above-described configuration, the sensor chip 11 and the DSP chip 13 are electrically connected by connecting a plurality of the micro pads 26 and 29 disposed with duplicate pitches with each other on the sensor chip 11 and the DSP chip 13, respectively. Thus, the pixel signals of each pixel column read out from the pixel array section 14 for each one row can be transferred in parallel from the sensor chip 11 to the DSP chip 13.

Also, the DSP chip 13, which has received the pixel signal transferred in parallel from the sensor chip 11, scans the pixel signal by the latch circuit 36 and the multiplexer 37, and thereby converts the pixel signal from the parallel signal to the serial signal, and inputs the signal into the next-stage signal processing circuit 25. Thus, although the pixel signal is transferred in parallel between the sensor chip 11 and the DSP chip 13, the signal processing circuit 25 can process the pixel signal by the serial processing.

Third Embodiment

Figure 7:
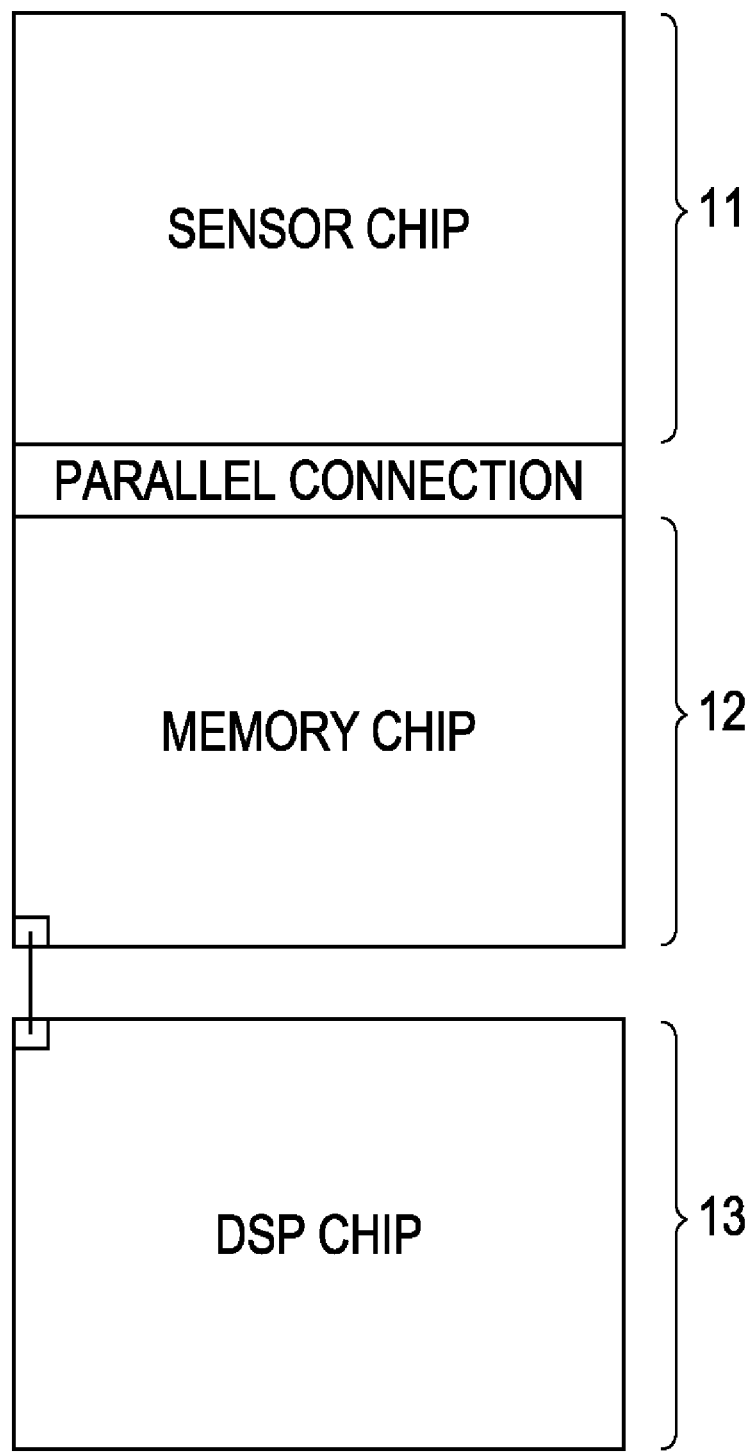
FIG. 7 is a schematic diagram illustrating an electrical connection state of a solid-state imaging device according to a third embodiment of the present invention.
Figure 8:
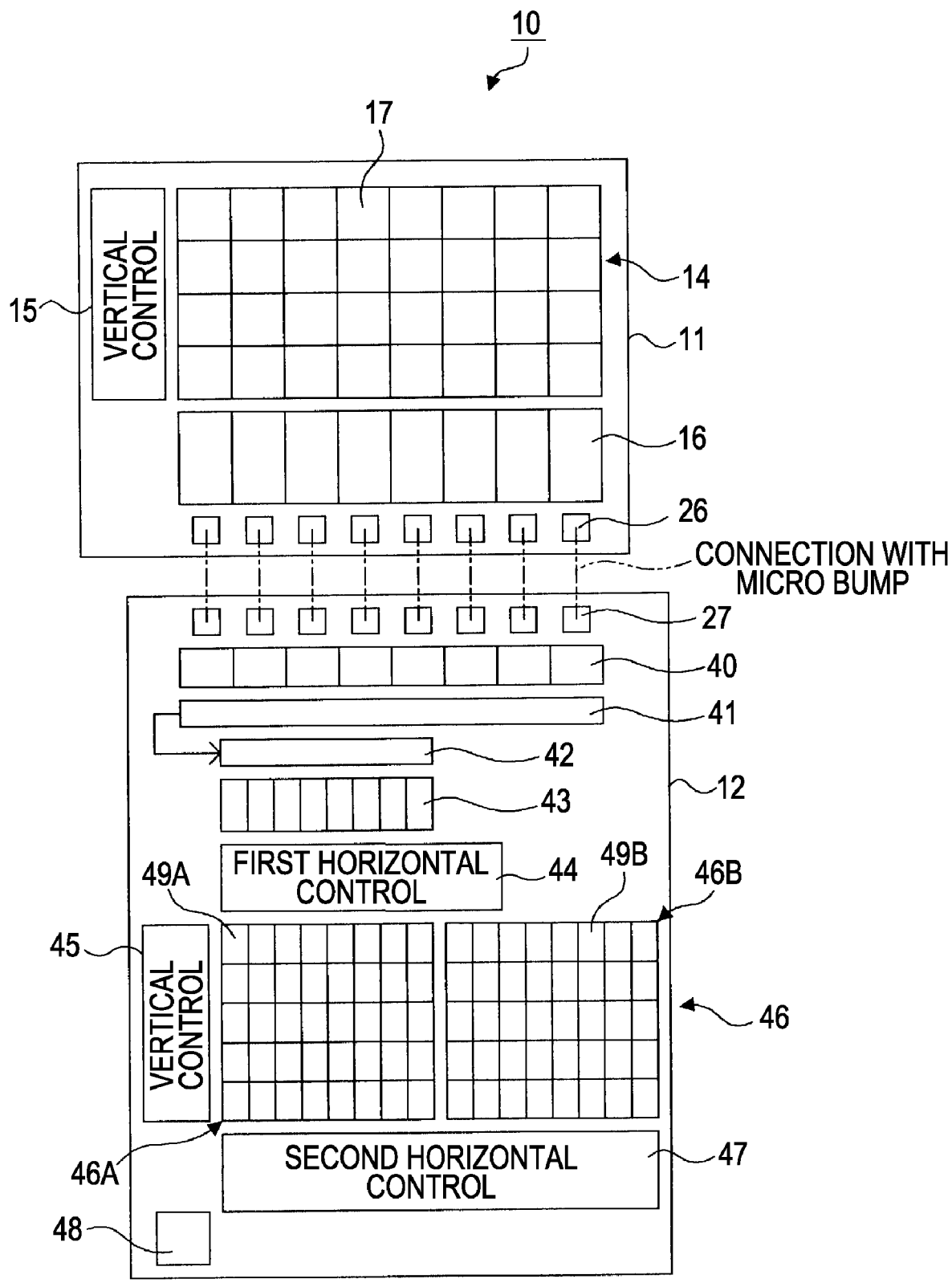
FIG. 8 is a development view illustrating the schematic configuration of the solid-state imaging device according to the third embodiment of the present invention.

FIG. 7 is a schematic diagram illustrating an electrical connection state of a solid-state imaging device according to a third embodiment of the present invention. Also, FIG. 8 is a development view illustrating the schematic configuration of the solid-state imaging device according to the third embodiment of the present invention. In this regard, in FIG. 8, the display of the DSP chip 13 is omitted. Also, in the third embodiment, the same components as those in the first embodiment and the second embodiment are marked with the same reference numerals, and the duplicate description will be omitted.

In the solid-state imaging device 10, the sensor chip 11 and the memory chip 12 are connected in parallel (column parallel) by micro bumps for example, for each unit pixel column using one pixel or a plurality of pixels (a few pixels) as one unit. Thus, the pixel signal is transmitted in parallel from the sensor chip 11 to the memory chip 12. Also, the memory chip 12 and the DSP chip 13 are connected by wire bonding, for example with a bus of about tens of bits in width. Accordingly, the pixel signal is serially transferred from the memory chip 12 and the DSP chip 13.

On the memory chip 12, a first column circuit 40, a first shift register 41, a second shift register 42, a second column circuit 43, a horizontal control circuit 44, a vertical control circuit 45, a memory circuit 46, a second horizontal control circuit 47, an interface circuit 48, etc., are formed. Also, the memory circuit 46 has a second memory area 46B in addition to a first memory area 46A capable of storing the pixel signal for at least one screen (one frame) The first memory area 46A is a memory area for storing the pixel signal transferred from the sensor chip 11, and the second memory area 46B is a area for use as a buffer during the signal processing of the DSP chip 13. The memory areas 46A and 46B are individually constituted by a plurality of memory cells 49A and 49B, respectively. Each of the memory cells 49A and 49B is constituted by, for example 16 bits as one memory unit.

The first column circuit 40 performs pre-processing, such as longitudinal stripe correction, white clip, etc., for example, on the pixel signal transferred in parallel from the sensor chip 11 to the memory chip 12. The first shift register 41 receives, in parallel, the pixel signal processed by the first column circuit 40, and sorts the pixel signal by transferring the pixel signal in sequence for each stage by the shift operation linked to the second shift register 42.

The first shift register 41 and the second shift register 42 has a structure of being folded back in the middle. Also, the pitch of each adjacent stage in the first shift register 41 and the pitch of each adjacent stage in the second shift register 42 are set to different pitches with each other. That is to say, the pitch of the first shift register 41 is set to match the pitch of the micro pads 27 formed on the memory chip 12. The pitch of the second shift register 42 is set to match the pitch of the memory cells 49A of the memory circuit 46 formed on the memory chip 12. In the present embodiment, the pitch of the micro pads 27 is larger than the pitch of the memory cells 49A, and thus the pitch of the first shift register 41 is larger than the pitch of the second shift register 42.

The second column circuit 43 performs the calculation processing (for example, addition processing) of the pixel signal stored in the second shift register 42, and the pixel signal written into and read from the memory circuit 46 in advance of that processing, and write-back processing of the calculation result into the memory circuit 46, etc. At that time, it is possible to correct camera shake in the lateral direction by subtly shifting the corresponding relationship between the first column circuit 40 and the second column circuit 43 in the shift register 41 and the second shift register 42.

The first horizontal control circuit 44 controls, for each memory cell, the writing or the reading of the signal on the memory cell 49A of the row selected by the vertical control circuit 45. When a signal is written into or read from the memory circuit 46, the vertical control circuit 45 selects the memory cells 49A, 49B to which the signal is written or read from by row, and drives the memory cells 49A, 49B of the selected row.

The second horizontal control circuit 47 controls, for each memory cell, the writing or the reading of the signal on the memory cell 49A, 49B of the row selected by the vertical control circuit 45. The interface circuit 48 performs the buffering of the signal, etc., when the signal is exchanged between the memory chip 12 and the DSP chip 13.

In the solid-state imaging device 10 having the above-described configuration, a plurality of micro pads 26 formed on the sensor chip 11 and a plurality of micro pads 27 formed correspondingly on the memory chip 12 are connected in parallel with micro bumps. At the same time, the pixel signal transferred in parallel from the sensor chip 11 to the memory chip 12 through the micro pads 26 and 27 portions (the connection parts by the micro bumps) connected in parallel is scanned by the two shift registers 41 and 42, and thereby the pixel signals are sorted from the first column circuit 40 to the second column circuit 43, and is input into the next-stage memory circuit 46. Also, the pitch of the circuit (in the present embodiment, the column circuit) holding the pixel signal is converted from the first pitch in the memory chip 12 into the second pitch, which is narrower, by sorting the pixel signal from the first column circuit 40 to the second column circuit 43 using the two shift registers 41 and 42 having different pitches. Thus, it becomes unnecessary to match the pitch (for example, the pitch of the column circuit 16) of the sensor chip 11 and the pitch (for example, the pitch of the memory area 46A) of the memory chip 12. Accordingly, it is not necessary to redesign the memory cell of the memory circuit 46 to meet the pitch (pixel pitch, column pitch, etc.) of the sensor chip 11. Also, it is not necessary to allocate a wide area (depth size) as needed in the case of converting the pitch by wiring.

Figure 10:
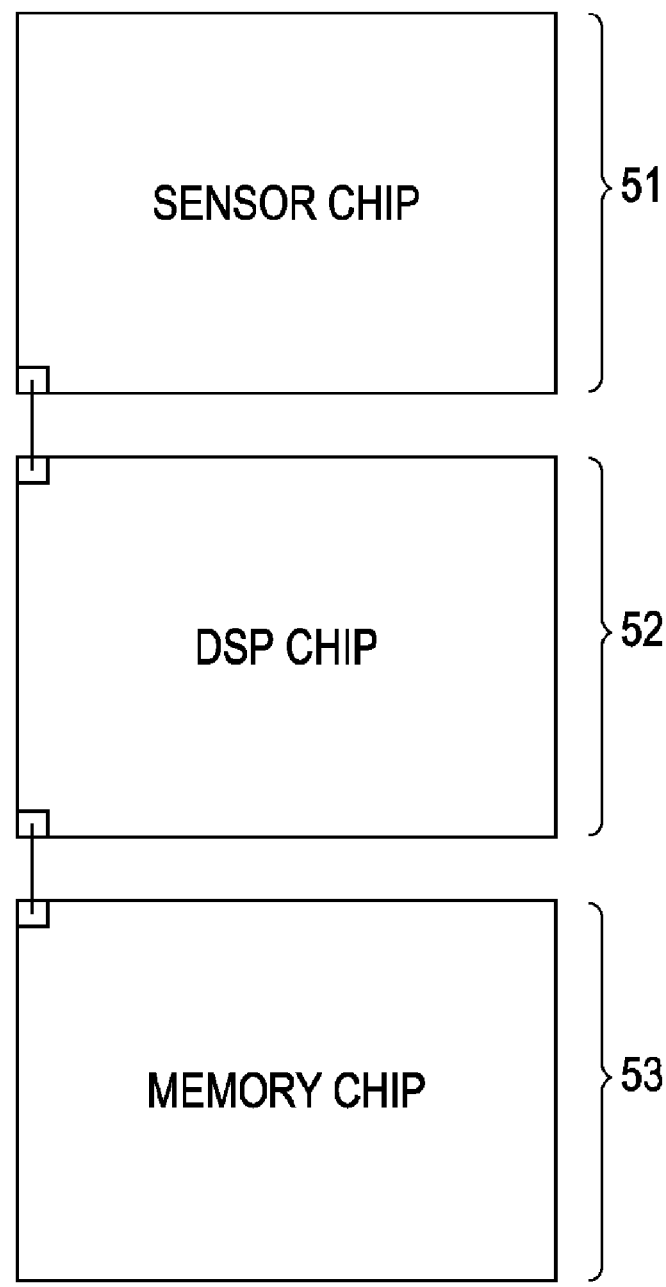
FIG. 10 is a schematic diagram illustrating an example of the configuration of a known solid-state imaging device.
Figure 11:
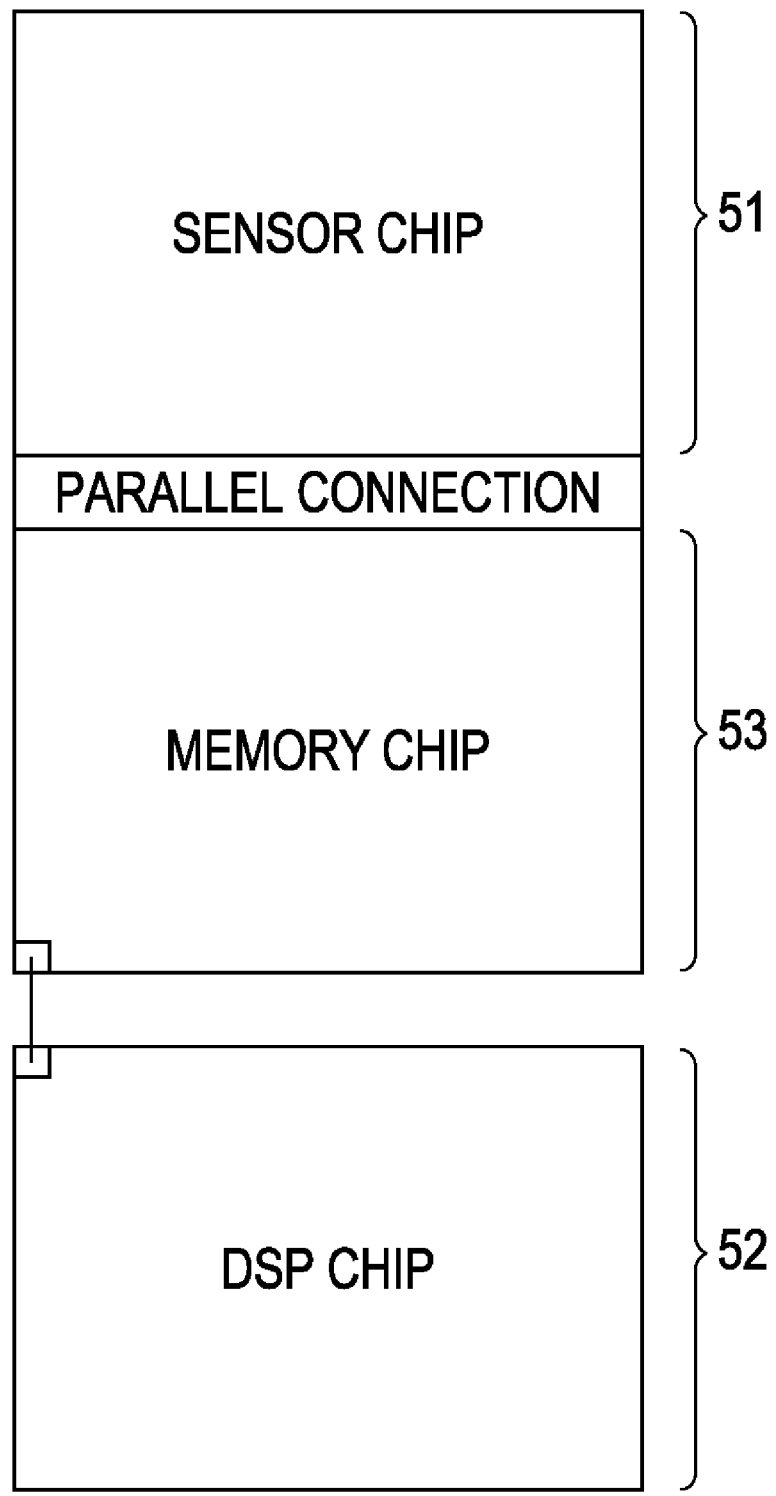
FIG. 11 is a configuration diagram in the case of connecting a sensor chip and a memory chip in parallel.
Figure 12:
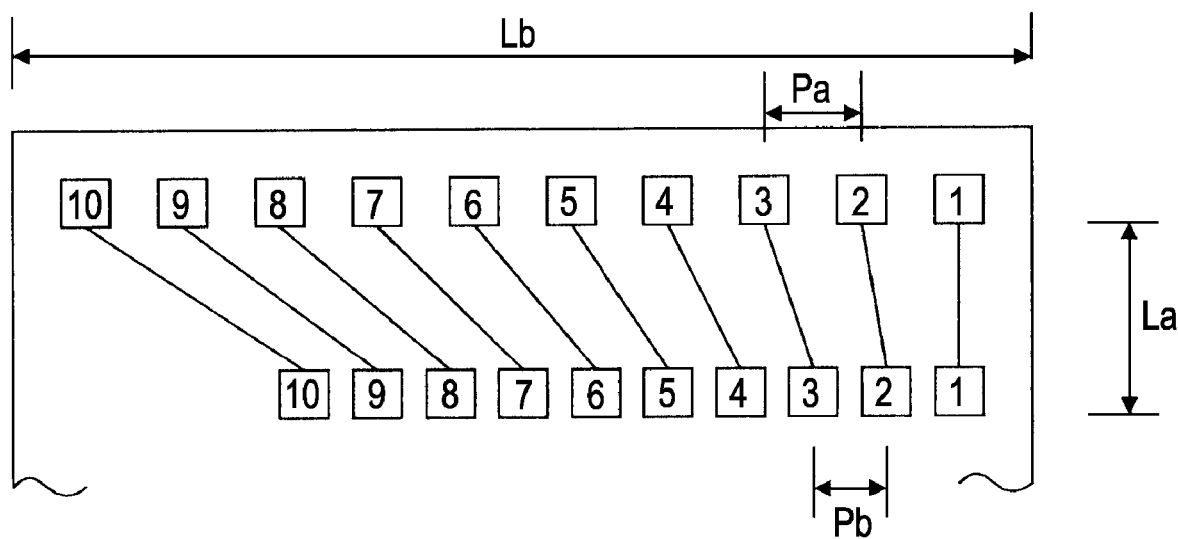
FIG. 12 is a diagram illustrating an example of the configuration of a wiring section for pitch conversion.

Also, when a comparison is made of the case where the pixel signal is transferred in parallel from the sensor chip 11 to the memory chip 12 with the case where the pixel signal is directly input into the memory circuit, the processing speed becomes low as much as the scanning of the pixel signal by the two shift registers 41 and 42. However, when a comparison is made of the case where the sensor chip and the memory chip are connected with a bus of small width as has been done so far (refer to FIG. 10), and the pixel signal is serially transferred from the sensor chip to the memory chip by horizontally scanning the pixel signal by the sensor chip, the processing speed becomes higher, and both the power consumption and the radiation become low.

In this regard, it is not necessary for the memory chip 12 to care about the parallel processing for the next stage. That is to say, when there is no column circuit, etc., on the memory chip 12, and only the role of saving an image should be played, a matrix relationship of the data is not important in particular, and thus the signal, which is horizontally scanned, should be serially input into the memory. In this case, it is possible to improve the degree of freedom in the bank configuration, etc.

Also, the pitch conversion in the memory chip 12 can be achieved by, for example the combination of a latch circuit and a multiplexer in addition to the combination of the column circuit and the shift register as described above.

Also, in each of the embodiments described above, micro bumps are used for connecting the two chips in parallel. However, the present invention is not limited to this, and, for example, capacity coupling or electromagnetic induction may be used for the connection.

Also, in each of the embodiments described above, an example is given of the solid-state imaging device detecting the intensity of the incident light reflected from an object as a physical-quantity detection apparatus detecting a physical quantity given from the outside. However, when applying to an imaging apparatus, it is possible to apply the device to any one of the apparatuses including an apparatus for processing still images, an apparatus for processing moving images, and an apparatus for processing both still images and moving images. Also, the present invention is not limited to a solid-state imaging device. The present invention can be generally applied to a physical-quantity detection device in which, as a component of a sensor, pixels which detect, as physical quantities, static capacities formed between a detection electrode and the surface of a finger in accordance with the concavity and the convexity of a fingerprint, or pixels which detect, as physical quantities given from the outside, the distribution of electromagnetic waves other than visible light, particles, pressure, and chemical substance, etc., are disposed in a two-dimensional matrix.

APPLICATION EXAMPLE

The solid-state imaging device 10 according to the above-described embodiments is suitable for using as an imaging device (an image input device) in the imaging apparatus, such as a digital still camera, a video camera, etc.

Here, an imaging apparatus is referred to a camera module which includes a solid-state imaging device as an imaging device, and an optical system forming an image of an object onto the imaging surface (light-receiving surface) of the solid-state imaging device, and is mounted on an electronic apparatus, such as a cellular phone, etc., and a camera system, such as a digital still camera, a video camera, etc., including the camera module.

Figure 9:
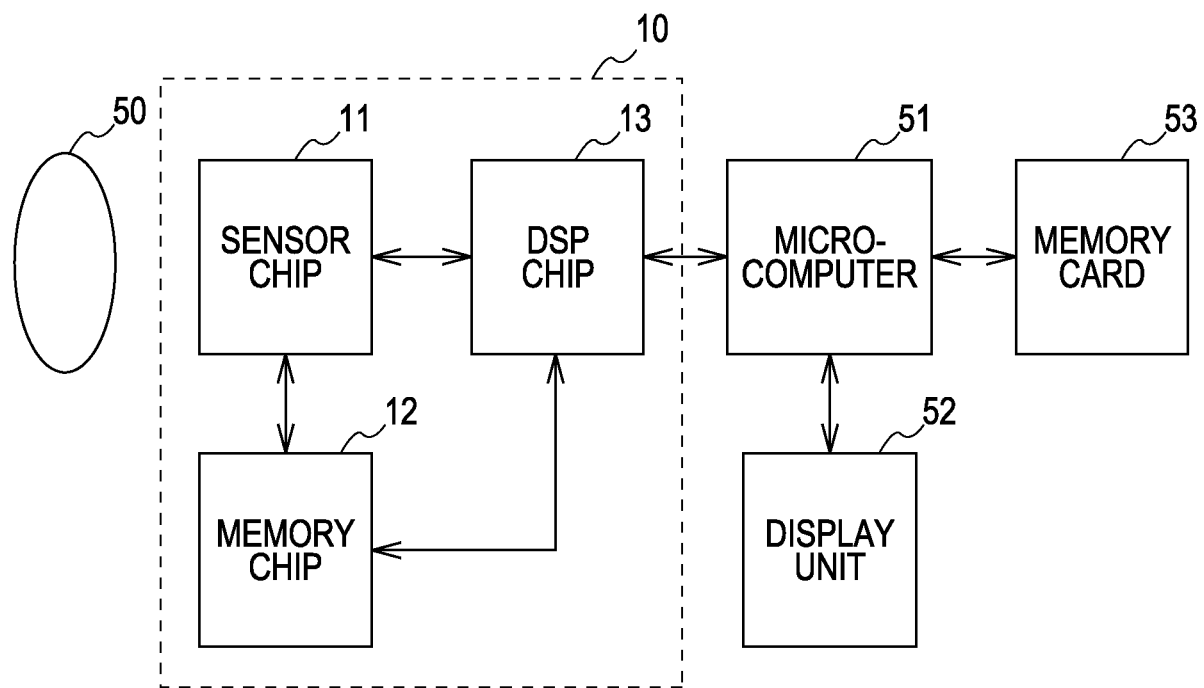
FIG. 9 is a block diagram illustrating an example of the configuration of an imaging apparatus according to the present invention.

FIG. 9 is a block diagram illustrating an example of the configuration of an imaging apparatus according to the present invention. The imaging apparatus according to the present embodiment includes an optical system including a lens 50, a sensor chip 11, a memory chip 12, a DSP chip 13, a microcomputer 51 for processing the image signal output from the DSP chip 13, a display unit 52 for displaying the image signal, a memory card 53 for recording the image signal, etc. The lens 50 leads the image light from an object into the imaging surface of the chip sensor 11 (CMOS image sensor). The optical system including the lens 50 is an image forming optical system. The CMOS image sensor formed on the chip sensor 11 converts the image light formed on the imaging surface of the sensor by the optical system including the lens 50 into an electrical signal for each pixel.

In this manner, in an imaging apparatus, such as a video camera, a electronic still camera, further, a camera module for a mobile apparatus, such as a cellular phone, etc., by using the solid-state imaging device 10 according to the above-described embodiments as the imaging device thereof, it becomes possible to exchange signals with eliminating the loss of the interface between the chips as much as possible at a high speed, with low power consumption, and low radiation.

It should be understood by those skilled in the art that various modifications, combinations, sub-combinations and alterations may occur depending on design requirements and other factors insofar as they are within the scope of the appended claims or the equivalents thereof.

What is claimed is:

1. A physical-quantity detection device comprising:
at least first and second semiconductor substrates secured together in a stacked relationship, the first semiconductor substrate including a pixel-array section in which pixels are arranged in a two-dimensional matrix having rows and columns,
wherein,
said pixels in said pixel array generate pixel signals,
each of the first and second semiconductor substrates has a plurality of terminals arranged along the same direction near a first edge of the substrate,
the terminals of the first and second substrates have the same pitch,
the terminals of the first and second substrates extend in the same direction as a row direction of the pixel-array section,
the terminals are positioned in registry with each other, the terminals are alternately staggered along the column direction,
the terminals of the first and second substrates are connected to each other by bump electrodes,
a plurality of dummy electrodes positioned between the first and second substrates along a second edge opposite the first edge in a manner to effectively maintain an even spacing between the first and second substrates,
each column of the pixel array has a corresponding terminal on the first substrate,
each terminal of the first substrate is connected in parallel to a corresponding one terminal of the second substrate,
the first semiconductor substrate transmits a pixel signal to the second semiconductor substrate in parallel through the terminals, and
the second semiconductor substrate includes circuitry configured to scan the transmitted pixel signal to input the signal into a next stage circuit.

2. The physical-quantity detection device according to claim 1, wherein the second semiconductor substrate includes circuitry configured to covert the parallel transmitted signal into a serial signal by scanning the parallel transmitted pixel signal.

3. The physical-quantity detection device according to claim 1, further comprising a third semiconductor substrate, and wherein:
the first semiconductor substrate having the pixel-array section is mounted on the second semiconductor substrate,
the second semiconductor substrate is mounted on the third semiconductor substrate, and
the three semiconductor substrates are laminated in three tiers and electrically connected together such that the first semiconductor substrate and the second semiconductor substrate are connected together and the second semiconductor substrate and the third semiconductor substrate are connected together.

4. The physical-quantity detection device of claim 2, wherein:
- said plurality of bump electrodes over said first semiconductor chip are positioned on one side of said first semiconductor chip, and
- said plurality of dummy bump electrodes over said first semiconductor chip are positioned on another side of said first semiconductor chip.

5. A physical-quantity detection device comprising:
- a first semiconductor chip having a pixel-array section in which image signals are generated;
- a second semiconductor chip in which image signals generated in said first semiconductor chip are processed,
- a plurality of bump electrodes positioned over respective first surfaces of said first and second semiconductor chips,
- wherein,
  - said plurality of bump electrodes are positioned in staggered relationship with respect to each other in a vertical direction.

6. The physical-quantity detection device according to claim 5, further comprising a third semiconductor substrate, and wherein:
- the first semiconductor substrate having the pixel-array section is mounted on the second semiconductor substrate,
- the second semiconductor substrate is mounted on the third semiconductor substrate, and
- the three semiconductor substrates are laminated in three tiers and electrically connected together such that the first semiconductor substrate and the second semiconductor substrate are connected together and the second semiconductor substrate and the third semiconductor substrate are connected together.

7. A physical-quantity detection device comprising:
- a first semiconductor chip having a pixel-array section in which image signals are generated;
- a second semiconductor chip in which image signals generated in said first semiconductor substrate are processed;
- a plurality of bump electrodes positioned over respective first surfaces of said first and second semiconductor chips;
- a plurality of dummy bump electrodes positioned over said first surfaces of said first and second semiconductor chips,
- wherein,
  - individual ones of the plurality of bump electrodes of said first semiconductor chip and individual ones of the plurality of bump electrodes of said second semiconductor chip are connected, and
  - said plurality of bump electrodes are positioned in staggered relationship with respect to each other in a vertical direction.

8. The physical-quantity detection device according to claim 7, further comprising a third semiconductor substrate, and wherein:
- the first semiconductor substrate having the pixel-array section is mounted on the second semiconductor substrate,
- the second semiconductor substrate is mounted on the third semiconductor substrate, and
- the three semiconductor substrates are laminated in three tiers and electrically connected together such that the first semiconductor substrate and the second semiconductor substrate are connected together and the second semiconductor substrate and the third semiconductor substrate are connected together.

* * * * *